United States Patent
Lu et al.

(10) Patent No.: US 7,283,406 B2
(45) Date of Patent: Oct. 16, 2007

(54) HIGH VOLTAGE WORDLINE DRIVER WITH A THREE STAGE LEVEL SHIFTER

(75) Inventors: Hsiao-Hua Lu, Thudong Township (TW); Chien-Fan Wang, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 190 days.

(21) Appl. No.: 11/178,904

(22) Filed: Jul. 11, 2005

(65) Prior Publication Data

US 2007/0008804 A1    Jan. 11, 2007

(51) Int. Cl.
*G11C 5/14* (2006.01)
*G11C 7/00* (2006.01)

(52) U.S. Cl. .............. 365/189.09; 365/189.11; 365/230.06

(58) Field of Classification Search .......... 365/189.11, 365/189.09, 185.23
See application file for complete search history.

(56) References Cited

U.S. PATENT DOCUMENTS 5,363,338 A * 11/1994 Oh ................. 365/230.06
6,442,082 B2 * 8/2002 Taura et al. ........... 365/189.11
6,992,926 B2 * 1/2006 Iwase et al. ........... 365/185.23
7,020,024 B2 * 3/2006 Sim .................... 365/185.23
7,177,226 B2 * 2/2007 Lee .................... 365/230.06

* cited by examiner

*Primary Examiner*—Amir Zarabian
*Assistant Examiner*—Michael Weinberg
(74) *Attorney, Agent, or Firm*—K & L Gates LLP

(57) ABSTRACT

A method and system is disclosed for a wordline driver circuit used for a memory device. It has a logic stage operating between a ground voltage and a first supply voltage and generating a logic stage output signal swinging between the ground voltage and the first supply voltage. It also has a mid voltage stage, operating between a raised ground voltage and a second supply voltage during the programming process, and generating a mid voltage stage output that swings between the second supply voltage and the raised ground voltage. It then has a high voltage stage, operating between the raised ground voltage and a third supply voltage, and generating a wordline driver output swinging between the third supply voltage and the raised ground voltage based on the received mid voltage stage output.

21 Claims, 8 Drawing Sheets

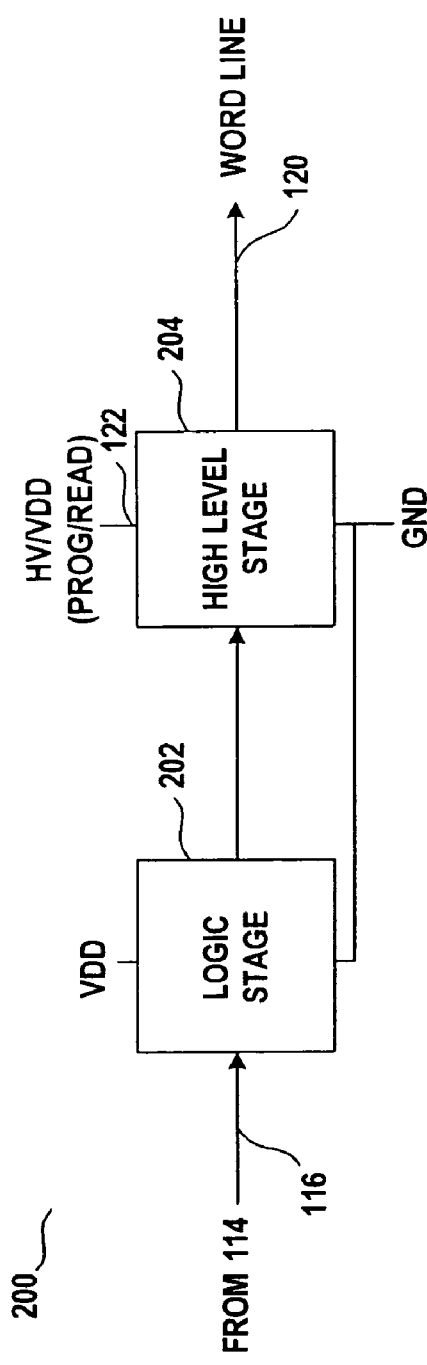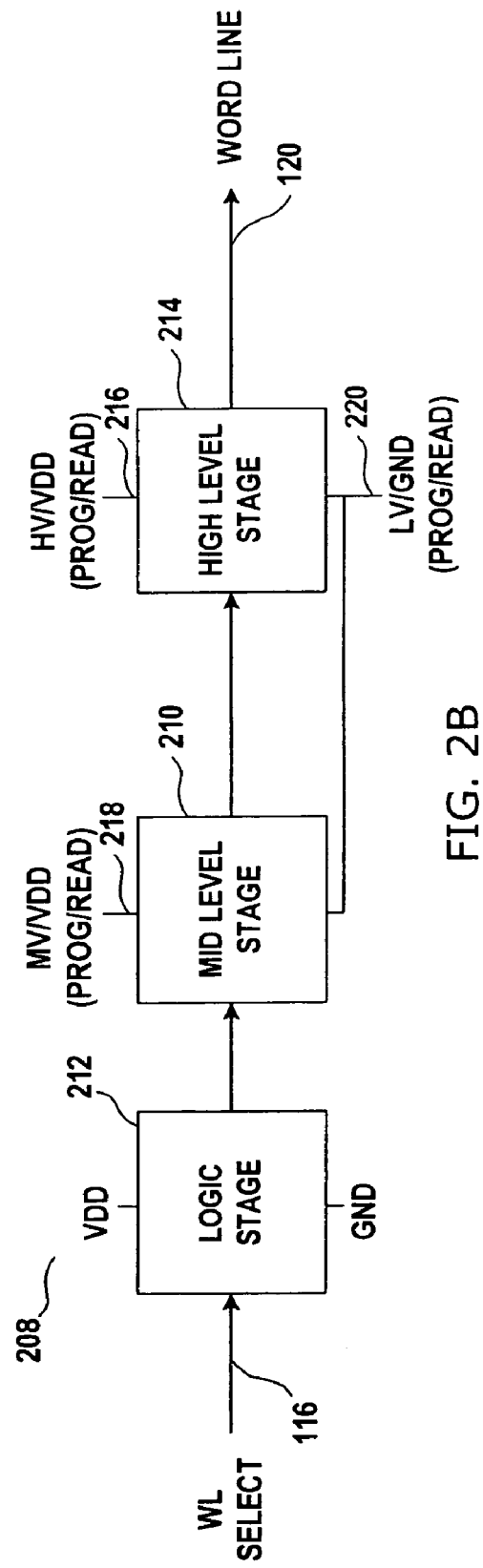

HIGH VOLTAGE WORDLINE DRIVER WITH A THREE STAGE LEVEL SHIFTER

BACKGROUND

The present invention relates generally to semiconductor devices, and more particularly to a high voltage wordline driver circuit implemented with a three stage level shifter for reducing high voltage stress conditions on transistor devices contained within the high voltage wordline driver circuit.

High voltage wordline driver circuits are used to apply voltages to the program/read gates of floating-gate transistors in integrated circuit (IC) memory cell arrays. When operated in a program mode, such drivers translate signals from integrated decoder circuits to signals, which must be of sufficiently high voltage to charge the floating gates. When operated in a read mode, the driver must provide a lower voltage signal having a rise-time sufficiently rapid enough to meet the operating speed requirements of the particular IC.

The task of constructing a driver circuit, in IC form, that not only is capable of furnishing the high voltage necessary for programming but also provides a rapid response time during the read operation, is difficult because driver transistors fabricated in IC form for high voltage (HV) use must have relatively long source-drain channels. The relatively long source-drain channels result in high capacitance characteristics that slow response time and decrease drive capability.

Conventional HV wordline driver circuits are typically comprised of a two-stage voltage level shifter. The first stage is a logic stage that translates signals from an integrated decoder circuit to signals necessary to drive the HV driver second stage. The logic stage operates at an operating voltage (VDD), which is typically less than 5VDC, and ground (GND). The second stage is the high-level driver stage that also acts as a voltage level shifter. The second stage input operates between 5VDC and GND while the second stage output typically produces either a low voltage (LV) of approximately 5VDC or less, or HV, which is a programming voltage typically greater than 12VDC. Because of this large level shifting between GND and more than 12VDC in the driver stage, conventional high voltage wordline driver circuits may experience driver transistor device stress caused by application of a HV that exceeds the transistor device's breakdown voltage. This condition can cause gated or punch through stress on the transistor device.

The use of high voltage NMOS and PMOS transistors is a potential solution to reduce the device stress. However, as explained above, HV transistors have a long source-drain channel that may slow the wordline drivers response time to the point where it may not meet the IC's operating speed requirements. A second potential solution is the use of a cascode driver structure. A cascode structure is a circuit structure in which typically two or more transistors are connected serially (they can be referred to as cascoded transistors). However, this solution adversely affects the slew rate (speed) of the wordline driver. Some conventional HV wordline driver circuits utilize a lifted ground, or floating ground, solution, but this concept results in variations of the ground level reference.

Therefore, desirable in the art of high voltage wordline driver circuits are improved circuit designs that eliminate the transistor device voltage stress condition without a cascode structure.

SUMMARY

In view of the foregoing, this invention improves the wordline driver's HV stress conditions and speed performance through the incorporation of a three stage voltage wordline driver circuit. It has a logic stage operating between a ground voltage and a first supply voltage and generating a logic stage output signal swinging between the ground voltage and the first supply voltage. It also has a mid voltage stage, operating between a raised ground voltage and a second supply voltage during the programming process, and generating a mid voltage stage output that swings between the second supply voltage and the raised ground voltage. It then has a high voltage stage, operating between the raised ground voltage and a third supply voltage, and generating a wordline driver output swinging between the third supply voltage and the raised ground voltage based on the received mid voltage stage output.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A presents a block diagram of a conventional two-stage HV wordline driver circuit.

FIG. 2B presents a block diagram of the new three-stage wordline driver circuit in accordance with various embodiments of the present invention.

DESCRIPTION

Figure 1:
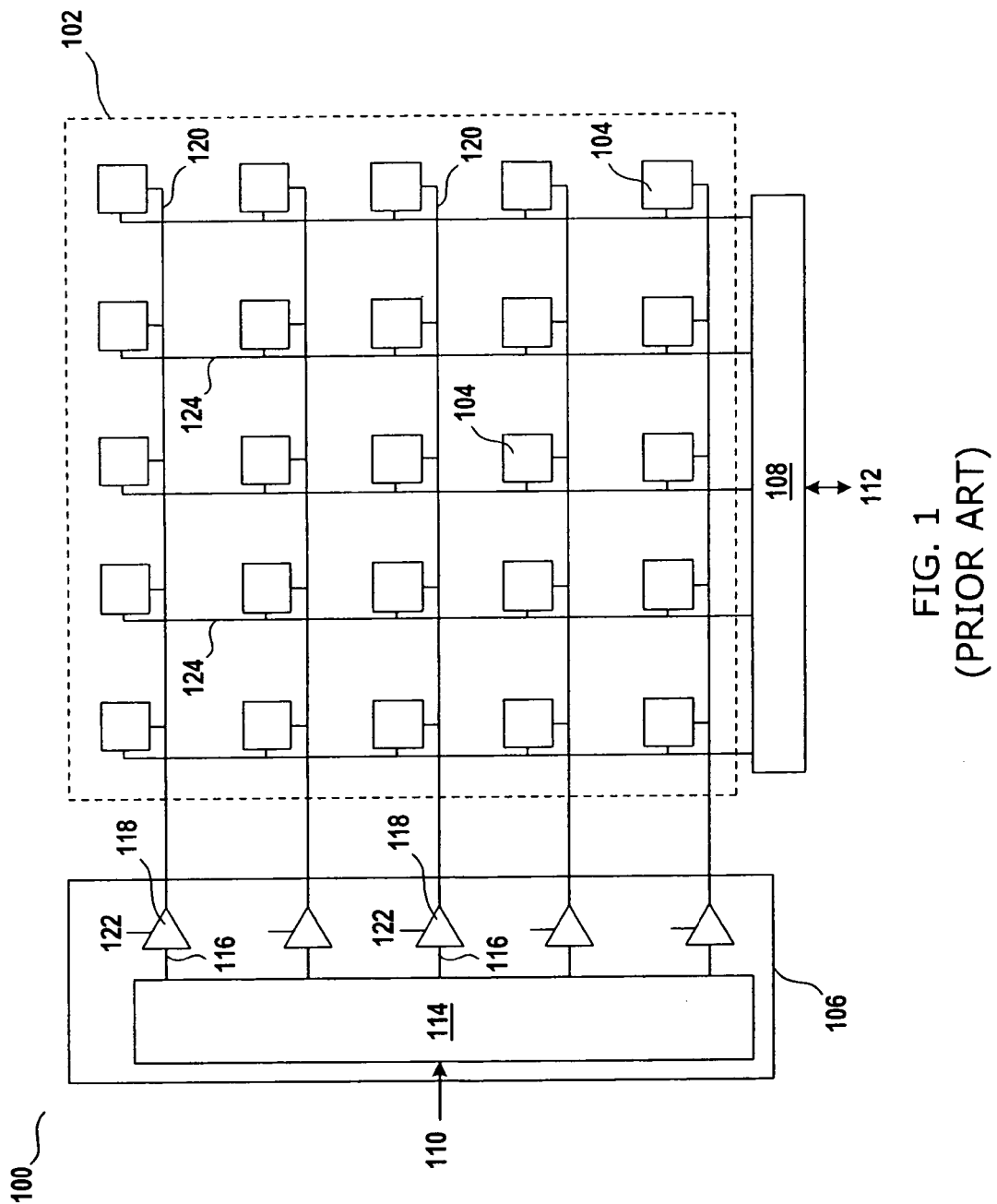
FIG. 1 presents a high-level circuit diagram of a typical memory cell array.

FIG. 1 presents a high-level circuit diagram of a typical IC memory cell array 100. The memory cell array 100 comprises a memory core 102 containing an array of individual memory cells 104, a row decoder/driver 106, and a column multiplexer/decoder 108. Each memory cell 104 is constructed of at least one floating-gate transistor that can be programmed with a bit value (1 or 0) during a "programming" operation. This memory cell information can subsequently be retrieved from each memory cell 104 by a "read" operation. The programming and read operation are controlled by a control logic contained within the IC (not shown). An address bus 110 and a data bus 112 are used in combination to select which individual memory cells 104 are selected for a read or a programming operation at a specific time. The address bus 110 is coupled to a row decoder 114.

The row decoder 114 deciphers the address bus information and selects, via one row select line 116, an appropriate HV wordline driver circuit 118 to drive a selected wordline 120. A HV/VDD line 122 provides either a HV or VDD supply voltage as set by the control logic, not shown. The HV wordline driver circuit 118 provides a high voltage, typically higher than 12VDC, which is necessary for the "programming" operation. Similarly, a low voltage, or VDD, is typically necessary for the "read" operation. The HV wordline driver circuit 118 drives the high capacitive load presented by various memory cells 104 on each wordline 120.

The column multiplexer/decoder 108 selects the appropriate column that will be read or programmed and activates that column using a bitline 124. The data bus 112 either inputs data to the memory core 102 for a programming operation or copies data from the memory core 102 for a read operation.

FIG. 2A presents a block diagram of a conventional two-stage HV wordline driver circuit 200. This circuit 200 is one example of the generic HV wordline driver circuit 118. With reference to FIGS. 1 and 2A, the circuit 200 comprises a logic stage 202 that receives a logic activated signal from the row decoder 114, via the row select line 116. The logic stage 202 operates from VDD and GND. The row select line 116 activates the appropriate HV wordline circuit to be accessed, while the HV/VDD line 122 determines if the circuit 200 outputs HV for programming operations, or VDD for read operations. In the circuit 200, the circuit's low output is always at the GND level.

The second stage is a high voltage stage 204 that acts as a driver for the wordline 120 and also as a voltage level shifter. The high voltage stage 204 input operates between VDD and GND while its output typically produces either an HV for a programming operation or VDD for a read operation. Because of this large voltage level shift ranging from GND to more than 12VDC in the second stage, the high voltage stage 204 transistors can experience excessive driver transistor device stress caused by application of a voltage that exceeds the transistor device's breakdown voltage. This condition can cause gate-aided breakdown or punch through stress on the output transistor devices.

FIG. 2B presents a block diagram of the new three-stage HV wordline driver circuit 208 in accordance with various embodiments of the present invention. This circuit 208 is used to replace the generic HV wordline driver circuit 118 shown in FIG. 1. The circuit 208 differs from the conventional two-stage HV wordline driver circuit 200 in that it contains a mid voltage stage 210, in addition to a logic stage 212 and a high voltage stage 214. The mid voltage stage 210 acts as a voltage level shifter circuit to isolate the logic stage 212, which operates from the VDD supply voltage, from the high voltage stage 214, which operates from the HV supply voltage during a programming operation.

Similar to the conventional two-stage HV wordline driver circuit 200, the row select line 116 activates the appropriate HV wordline circuit to be accessed, while the HV/VDD line 216 determines if the circuit 200 outputs HV, for a programming operation, or VDD, for a read operation, as determined by a program enabling signal generated by the IC logic (not shown).

The logic stage 212 operates between VDD and GND only. The mid voltage stage 210 operates between a midlevel voltage MV and a lower level voltage LV during a programming operation, or between VDD and GND during a read operation. The high voltage stage 214 operates between HV and LV during a programming operation, or between VDD and GND during a read operation. The dual voltages at the HV/VDD line 216, a MV/VDD line 218 and a LV/GND line 220 track each other during the program mode and the read mode under the control of IC logic (not shown). In one example, in the memory array program mode, the voltage is HV at the HV/VDD line 216, MV at the MV/VDD line 218, and LV at the LV/GND line 220. In another example, in the memory array read mode, the voltage is VDD at the lines 216 and 218, and GND at the LV/GND line 220.

The mid voltage stage 210 utilizes a MV supply voltage during the programming operation that is higher than VDD+Vtn, where Vtn is the gate threshold voltage of the NMOS transistor driver (shown later) in the high voltage stage 214, but lower than the HV supply voltage. The value of the MV supply voltage is selected to ensure that the NMOS transistor driver of the high voltage stage 214 is fully turned on, and that the voltage stress condition on the driver of the high voltage stage 214 is reduced or eliminated without the need for a multiple NMOS transistors cascode transistor structure in the high voltage stage 214. During the read operation, the MV/VDD supply voltage transitions to VDD.

During the programming operation, the new three-stage HV wordline driver circuit 208 supplies HV, where HV is bigger than MV, which is bigger than VDD or LV, which is also bigger than GND, to the memory cell 104 via the wordline 120. During the read operation, the new three-stage HV wordline driver circuit 208 supplies a low voltage, where the voltage at the HV/VDD line 216 is VDD and the voltage at the LV/GND line 220 is GND.

The LV/GND line 220 is connected to both the mid voltage stage 210 and the high voltage stage 214 and transitions from an LV for the programming operation to GND for the read operation. The LV voltage level is selected to provide a raised ground level, during the program mode. The LV voltage level is selected to suppress the gate-aided breakdown of the PMOS output transistors of the high voltage stage 214. Punch through and gate oxide stress are also suppressed in a similar fashion. Furthermore, the junction breakdown is suppressed without the need for a cascode output transistor structure, which would reduce the circuit's slew rate. The LV voltage level can be higher or lower than VDD, depending upon the circuit's high voltage stress conditions and memory cell disturbance conditions.

Figure 3A:
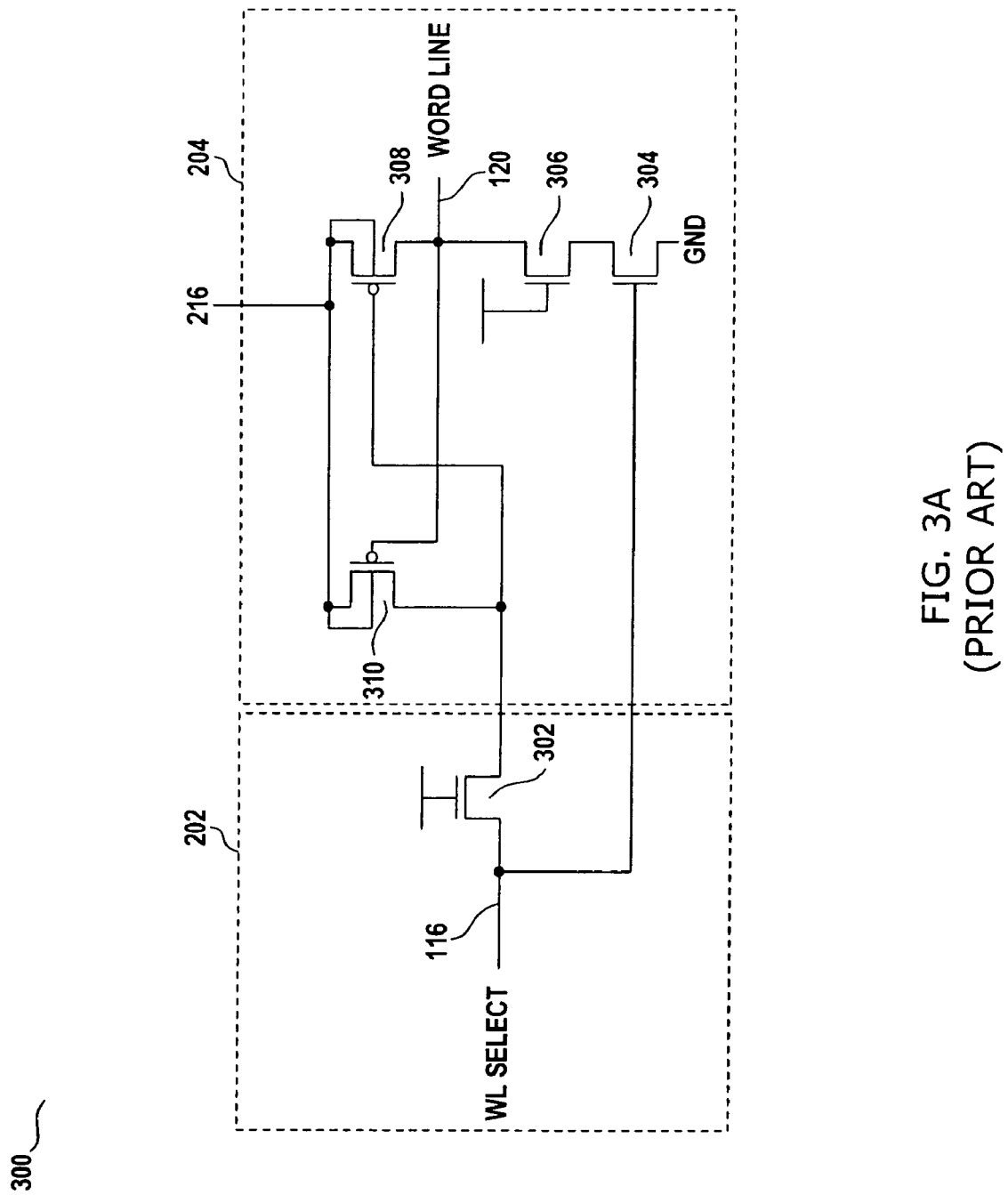
FIG. 3A presents one example of a conventional two-stage HV wordline driver circuit.

FIG. 3A presents an example of a conventional two-stage HV wordline driver circuit 300. With reference to both FIGS. 2A and 3A, the HV/VDD line 216 to the high voltage stage 204 is varied from a programming voltage typically higher than 12VDC to a read voltage VDD by a program enabling signal generated by the IC logic (not shown). This capability allows HV to be applied to the wordline 120 when the selected memory cells are to be programmed, and VDD to be applied to the wordline 120 when the read operation is performed. The logic stage 202 receives the WL select signal 116 from control logic within the IC (not shown). When the WL select signal 116 is a 1 or high (VDD), a pass transistor 302 is off and cascoded NMOS driver transistors 304 and 306 are turned on, pulling the wordline 120 to ground. The ground on the wordline 120 pulls the gate of a PMOS transistor 310 to ground, thus turning on PMOS transistor 310 and applying HV to the gate of a PMOS driver transistor 308, thereby latching it and turning it off. When the WL select signal 116 is a 0 or low (VSS), the pass transistor 302 is turned on, while the cascoded NMOS driver transistors 304 and 306 are turned off. The low on the WL select signal 116 is passed by the transistor 302 to the gate of the PMOS driver transistor 308, thereby turning the PMOS driver transistor 308 on and supplying either HV for a program operation or VDD for a read operation to the wordline 120. The HV on the wordline 120 is sent to the gate of the PMOS transistor 310, thereby turning it off. This also keeps the low on the gate of the PMOS transistor 308.

High level stage PMOS driver transistor 308 and PMOS transistor 310 experience an over-voltage stress condition due to the extremes of HV and GND experienced on their drain to gate junctions. These devices will suffer from gate-aided breakdown and punch through stress as well as gate oxide stress. Transistor junction breakdown may also eventually occur. Pass transistor 302 and NMOS driver transistor 306 are used to reduce the stress on the PMOS driver transistor 308 and the NMOS driver transistor 304 respectively by acting as a high resistance switch, which reduces the voltage potential across their junctions. Although the NMOS driver transistors 304 and 306 are protected from this high voltage overstress condition due to the use of the cascode transistor structure, this cascode transistor circuit will suffer from reduced circuit slew rate, which may not meet the IC operating speed requirements. In this two-stage HV wordline driver circuit 300, the GND line remains at ground potential whether in the programming or read operation.

Figure 3B:
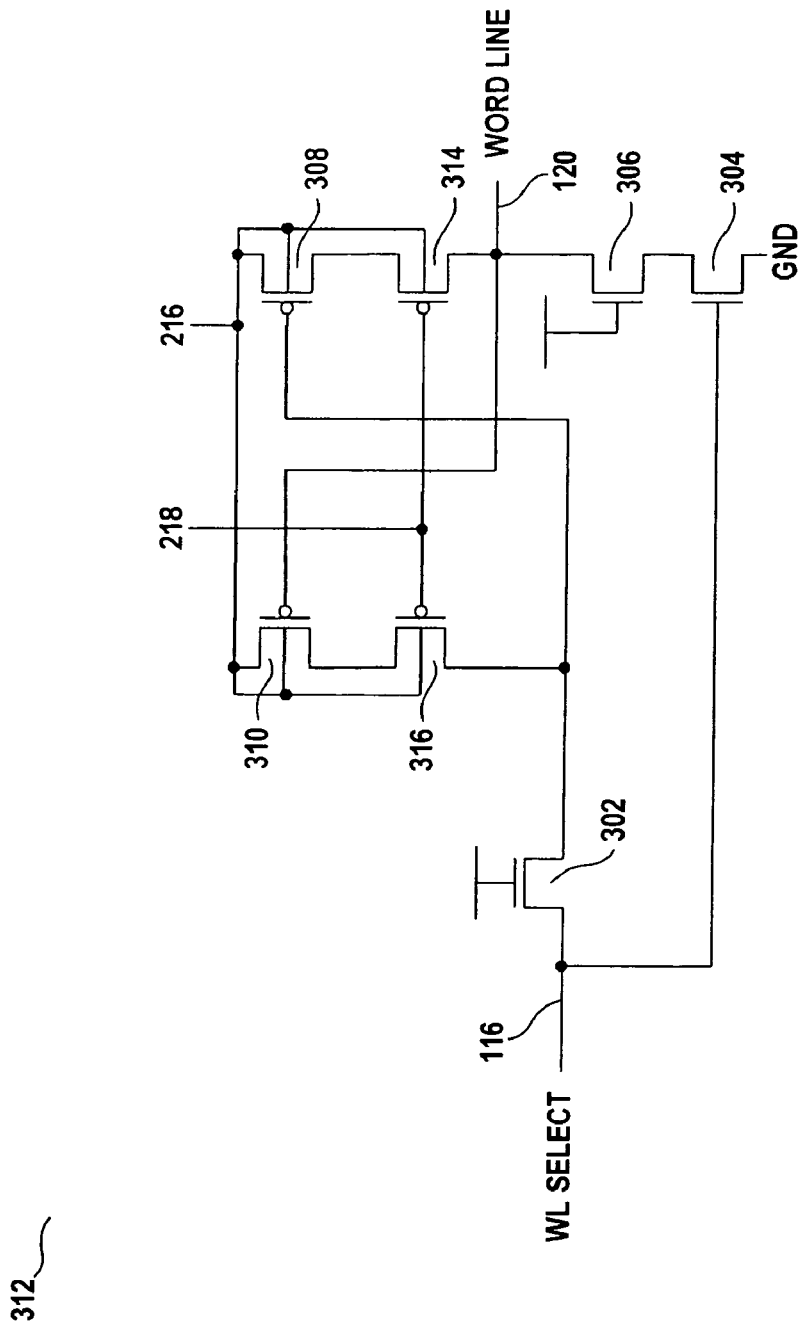
FIG. 3B presents a second example of a conventional two-stage HV wordline driver circuit.

FIG. 3B presents a second example of a conventional two-stage HV wordline driver circuit 312. This second example is similar to the previous two-stage HV wordline driver circuit 300 except that a PMOS driver transistor 314 and a PMOS transistor 316 have been added to form a cascode transistor structure respectively with the PMOS driver transistor 308 and the PMOS transistor 310, and that a medium voltage, applied at a power supply line MV/VDD, is used for biasing the PMOS driver transistor 314 and the PMOS transistor 316 to reduce the over-voltage stress on the PMOS driver transistor 308 and the PMOS transistor 310. The cascode structures formed by the transistors 308 and 314 and by the transistors 310 and 316 reduce the over-voltage stress on these transistors, but at the expense of circuit slew rate. In this circuit, the PMOS driver transistor 308 and the PMOS transistor 310 will still experience gate oxide stress. When the gate of the PMOS driver transistor 308 is pulled to ground, and when the WL select signal 116 goes to a low, and its drain is tied to HV by the HV/VDD line 216, an overstress condition will occur. Also, when the gate of the PMOS transistor 310 is pulled to ground, and when the wordline 120 is pulled to a low by the NMOS driver transistors 304 and 306, and its drain is tied to HV by the HV/VDD line 216, an overstress condition will also occur. The over-voltage stress on the PMOS driver transistor 308 and the PMOS transistor 310 will be reduced due to the use of a medium voltage MV, where VDD<MV<HV, at the gate bias voltage of the PMOS driver transistor 314 and the PMOS transistor 316. However, the PMOS driver transistor 308 and the PMOS transistor 310 may still suffer from a reduced level of junction stress. Similar to the circuit 300, the pass transistor 302 and the NMOS driver transistor 306 are used to reduce the stress on the PMOS driver transistor 308 and the NMOS driver transistor 304, respectively, by acting as a high resistance switch, which reduces the voltage potential across their junctions.

Figure 4:
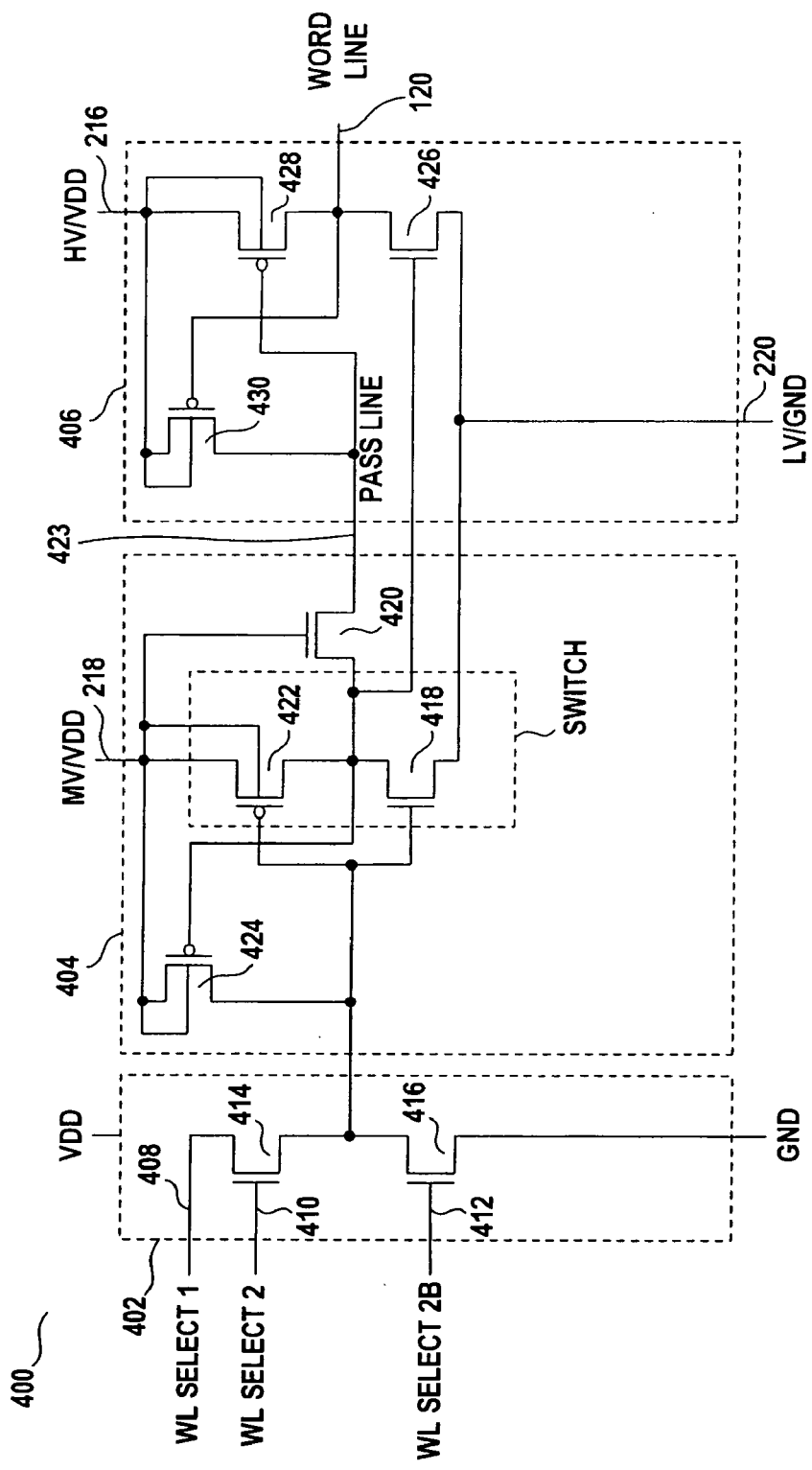
FIG. 4 presents a new three-stage wordline driver circuit in accordance with one embodiment of the present invention.

FIG. 4 presents a new three-stage wordline driver circuit 400 in accordance with a first embodiment of the present invention. The wordline driver circuit 400 comprises a logic stage 402, a mid voltage stage 404, and a high voltage stage 406. The logic stage 402 operates with the regular (or relatively low) supply voltages VDD and GND. The logic stage can be of various designs, but is not preferred to be coupled directly with the high voltage stage. With reference to both FIGS. 2B and 4, the mid voltage stage 404 operates from the MV or VDD as supplied at the MV/VDD line 218. The high voltage stage 406 operates from the HV or VDD as supplied at the HV/VDD line 216. Both the mid voltage stage 404 and the high voltage stage 406 operate from either a LV grounding level, where LV is larger than the normal ground level GND (which is used in the logic stage), or GND using a dual grounding scheme as supplied at the LV/GND line 220. The dual voltages at the HV/VDD line 216, the MV/VDD line 218, and at the LV/GND line 220 may track each other during the program mode and the read mode under the control of IC logic. For example, in the memory array program mode, the voltage is HV at line 216, MV at the line 218, and LV at the line 220. In the memory array read mode, the voltage is VDD at the line 216 and the line 218, and GND at the line 220. This capability reduces the over-voltage stress on the high voltage stage transistors. A voltage difference between a gate of a pull-down transistor 426 in the high voltage stage 406, whose drain provides a wordline driver output, and its source is no more than the difference between the second supply voltage MV/VDD and the raised ground voltage LV/GND. A difference between the second supply voltage MV/VDD and the raised ground voltage LV/GND is no smaller than a threshold voltage of the pull-down transistor 426.

More specifically, in this example, when a line 408 is low, the wordline 120 is disabled. When the line 408 is high, a line 410 is high and a line 412 is low, an NMOS transistor 414 is gated on, while an NMOS transistor 416 is turned off. VDD is then applied to the gate of a transistor 418 to turn on a transistor 418, which further applies the voltage LV of the LV/GND line 220 to the source of an NMOS transistor 420, to the gate of an NMOS transistor 426, to the drain of a PMOS transistor 422 and to the gate of a PMOS transistor 424. The transistors 418 and 422 effectively work as a switch for selecting between the lines 218 and 220, while the transistor 420 effectively work as a pass gate for providing the selected line to the high voltage stage 406 through a pass line 423. The PMOS transistor 424 is then turned on and latches the gate of the PMOS transistor 422 to MV, thereby turning it off. The LV applied to the gate of the NMOS transistor 426 turns the transistor 426 off. The LV applied on the source of the NMOS transistor 420 turns the transistor 420 on, which then applies the LV signal to the gate of a PMOS transistor 428 to turn on the transistor 428, which then pulls the wordline 120 to HV. The gate of a PMOS transistor 430 is tied to the wordline 120, therefore when the wordline 120 goes to HV, the PMOS transistor 430 is turned off, thus allowing the gate of the PMOS transistor 428 to remain at LV. In this case, the gate and source nodes of the NMOS 426 is the difference between LV and HV (which is preferred to be smaller than the breakdown voltage of the NMOS transistor), not between GND and HV, so that the stress is reduced.

When the line 408 is high, the line 410 is low, and the line 412 is high, the NMOS transistor 416 is gated on, while the NMOS transistor 414 is turned off. GND is then applied to the gate of the NMOS transistor 418 to turn off the transistor 418. GND is also applied to the gate of the PMOS transistor 422 to turn on the transistor 422. This applies MV to the source of the NMOS transistor 420 and to the gate of the PMOS transistor 424. The PMOS transistor 424 is then turned off. The MV applied on the source of the NMOS transistor 420 is also applied to the gate of the NMOS transistor 426, thereby fully turning on the NMOS transistor 426 since MV can be set such that the difference between MV and LV is still no smaller than the threshold voltage of the NMOS transistor 426. When the NMOS transistor 426 is fully turned on, the wordline 120 is pulled to LV. The MV applied on the source of the NMOS transistor 420 turns the NMOS transistor 420 off. Since the gate of the PMOS transistor 430 is tied to the wordline 120, when the wordline 120 goes to LV, the PMOS transistor 430 is turned on. Thus the gate of PMOS transistor 428 is latched at HV, which turns the PMOS transistor 428 off.

It is noted that the node between the transistors 414 and 416 can be viewed as a logic stage output which swings between VDD and GND. When this logic stage output comes into the mid voltage stage, it is also the input of the mid voltage stage. The mid voltage stage generates a mid stage output at the node between transistor 422 and 418, which swings between MV and LV during the programming process. The mid voltage stage output is also the input to the high voltage stage, which may control different transistors as needed, thereby eventually generate a high voltage stage output or the wordline output that swings between HV and LV. It can been seen that the three stage level shifter gets the final result through this staged approach.

This embodiment eliminates the high voltage stress conditions on the PMOS transistors 428 and 430 by judicious selection of the MV and LV voltage levels. It is understood that in the high voltage stage, the PMOS transistor 428 is a pull-up transistor and the NMOS transistor 426 is a pull-down transistor, both of them are the key elements of the driver circuit in the high voltage stage. Since the drain and gate of the PMOS transistor 430 are cross-connected with the drain and gate of the pull-up PMOS transistor 428, it generates a signal for controlling the gate of the output PMOS transistor 428 based on the output at the drain thereof. As such, the PMOS transistor 430 may be referred to as a feedback gate control PMOS transistor. The MV voltage level applied to the NMOS transistor 426 can turn it on without imposing excessive stress on the gate. As such, a cascode structure of multiple NMOS transistors is not needed, which would adversely affect the circuit's slew rate, hence lower its operating speed. As stated above, the difference between MV and LV is preferred to be larger than the threshold voltage of the NMOS transistor 426. On the other hand, for the PMOS transistors 428 and 430, the maximum voltage differential in this embodiment across the PMOS transistors 428 and 430 gate to source is HV–LV, which is preferred to be smaller than the breakdown voltage of the NMOS transistor 426. Since the LV is raised to reduce the difference, the PMOS transistors 428 and 430 are protected from voltage overstress, thereby avoiding gated punch through and gate oxide stress thereof.

Figure 5:
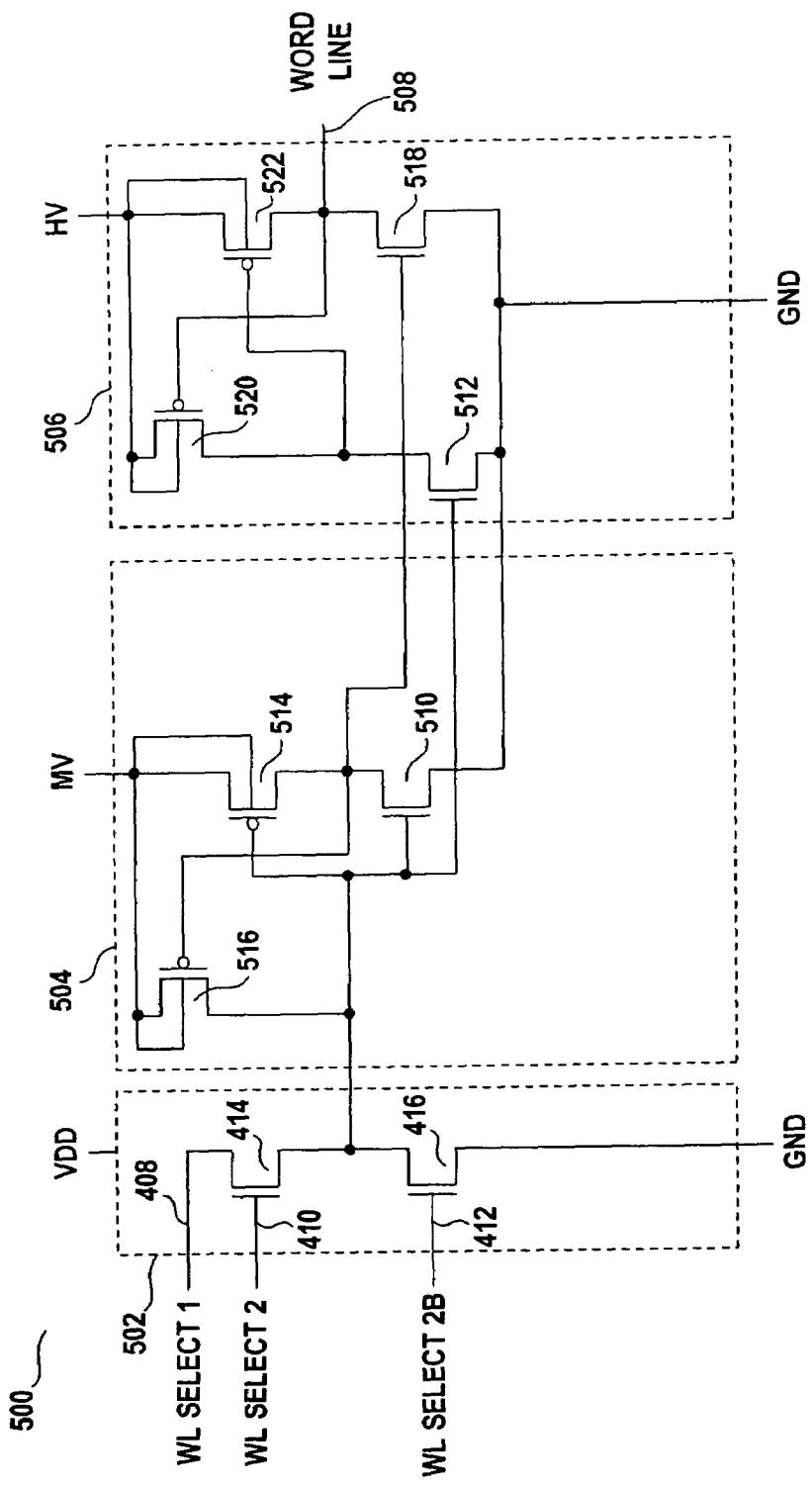
FIG. 5 presents a new modified three-stage wordline driver circuit in accordance with a second embodiment of the present invention.

FIG. 5 presents a new utilization of a three-stage HV wordline driver circuit 500 in accordance with a second embodiment of the present invention. This circuit 500 is used as a voltage translator circuit. In this embodiment, there are three stages: a logic stage 502, a mid voltage stage 504, and a high voltage stage 506. However in this circuit 500, the high voltage stage 506 utilizes a fixed GND level and a fixed HV such as 1.0V, which is lower than either the VDD supply voltage (e.g., 1.8V) or the MV supply voltage (where MV can vary from 1.8V to the normal MV voltage level). Thus the output voltage at the output line 508 varies from 1.0V to GND with an input logic stage operating from 1.8V to GND. In this case, no high voltage stress conditions are present due to the low HV. Rather, the three-stage HV wordline drive circuit 400 can be modified as shown in the circuit 500 to perform other functions such as level shifting. Moreover, all the PMOS transistors are not driven by any signals from the mid voltage stage so that they are fully isolated. This is referred to as a full latch level shifter.

The logic stage 502 operates similar to the logic stage 402 of FIG. 4. When the input to the mid voltage stage 504 (unction of the NMOS transistors 414 and 416 affected by WL Select 1, 2, and 2B) is low, NMOS transistors 510 and 512 are off and PMOS transistor 514 is on, thus pulling the gate of a PMOS transistor 516 to MV, effectively turning off the PMOS transistor 516. At the same time, the MV on the gate of an NMOS transistor 518 turns on the transistor 518, thereby pulling an output line 508 to GND. The low output line 508 is tied to the gate of a PMOS transistor 520, which latches the PMOS transistor 520 on and forces a PMOS output transistor 522 into an off state. The NMOS transistor 512 and the PMOS transistor 520 form a full latch circuit which ensures a full isolation between the MV and HV power stages for proper operation of the PMOS transistor 522.

When the input to the mid voltage stage 504 is high, the NMOS transistors 510 and 512 are on, while the PMOS transistor 514 is turned off, thus pulling the gate of the PMOS transistor 516 to GND, effectively turning on the transistor 516 and latching the MV on the gate of the PMOS transistor 514. The MV on the gate of the PMOS transistor 514 turns off the PMOS transistor 514. With the NMOS transistor 510 on, the gate of the NMOS transistor 518 is pulled to GND, effectively turning off the NMOS transistor 518. With the NMOS transistor 512 on, the gate of the PMOS transistor 522 is pulled to GND which turns on the PMOS transistor 522 for applying HV to the output line 508. Since the HV on the output line 508 is now tied to the gate of PMOS transistor 520, the PMOS transistor 520 is turned off.

Figure 6:
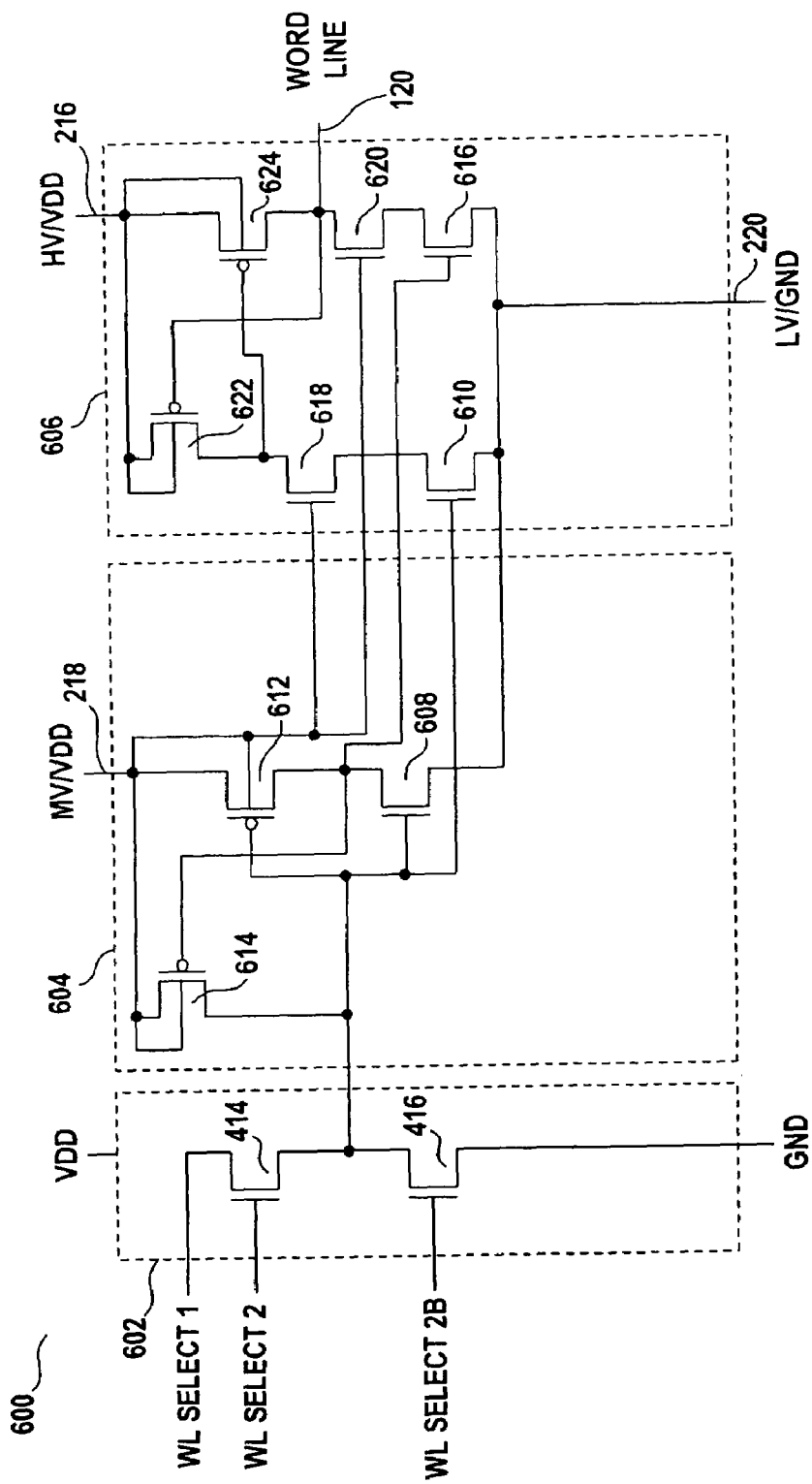
FIG. 6 presents a new modified three-stage wordline driver circuit in accordance with a third embodiment of the present invention.

FIG. 6 presents a new three-stage HV wordline driver circuit 600 in accordance with a third embodiment of the present invention. The HV wordline driver circuit 600 comprises a logic stage 602, a mid voltage stage 604, and a high voltage stage 606.

With reference to both FIGS. 2B and 6, the changing of the ground level at the LV/GND line 220 from GND to LV when switching from program mode to read mode can cause memory cell disturbances. This is due to the reduced noise margin that occurs with an elevated ground level such as LV. The addition of NMOS cascode structures formed by NMOS transistors 616 and 620, and by NMOS transistors 610 and 618, will maintain the noise margin and thus prevent the memory cell disturbances without raising LV to too high a level.

The logic stage 602 operates from the VDD supply voltage and GND. The logic stage 602 operates similar to the logic stage 402 of FIG. 4. When the input to the mid voltage stage 604, which is the junction between the NMOS transistors 414 and 416, is low, NMOS transistors 608, 610, and 618 are off, while PMOS transistor 612 is turned on, thus pulling the gate of a PMOS transistor 614 to MV/VDD, which is supplied through the line 218, and effectively turning off the transistor 614. At the same time, the MV/VDD applied to the gate of NMOS transistor 616 turns on the NMOS transistors 616 and 620, thereby pulling the wordline 120 to GND. The wordline 120 is tied to the gate of a PMOS transistor 622 which latches the transistor 622 on and forces a PMOS output transistor 624 into an off state. The NMOS transistors 618 and 620 are also required to prevent NMOS junction breakdown of the transistors 610 and 616 respectively.

When the input to the mid voltage stage 604 is high, the NMOS transistors 608 and 610 are on. Since the PMOS transistor 612 is also turned off, the gate of the PMOS transistor 614 is pulled to LV/GND, effectively turning on the PMOS transistor 614 and providing MV on the gate of the PMOS transistor 612. The MV on the gate of the PMOS transistor 612 turns off the PMOS transistor 612. The NMOS transistor 618 is turned on when the NMOS transistor 610 is turned on, thus pulling the gate of the PMOS transistor 624 to LV/GND and effectively turning the transistor 624 on and supplying, through the line 216, HV/VDD to the wordline 120. At this time, the NMOS transistor 616 has LV/GND applied to its gate, thereby effectively turning off the NMOS transistors 616 and 620. The HV on the wordline 120 is tied to the gate of the PMOS transistor 622, which latches the PMOS transistor 622 off and keeps the PMOS output transistor 624 in an on state.

Figure 7:
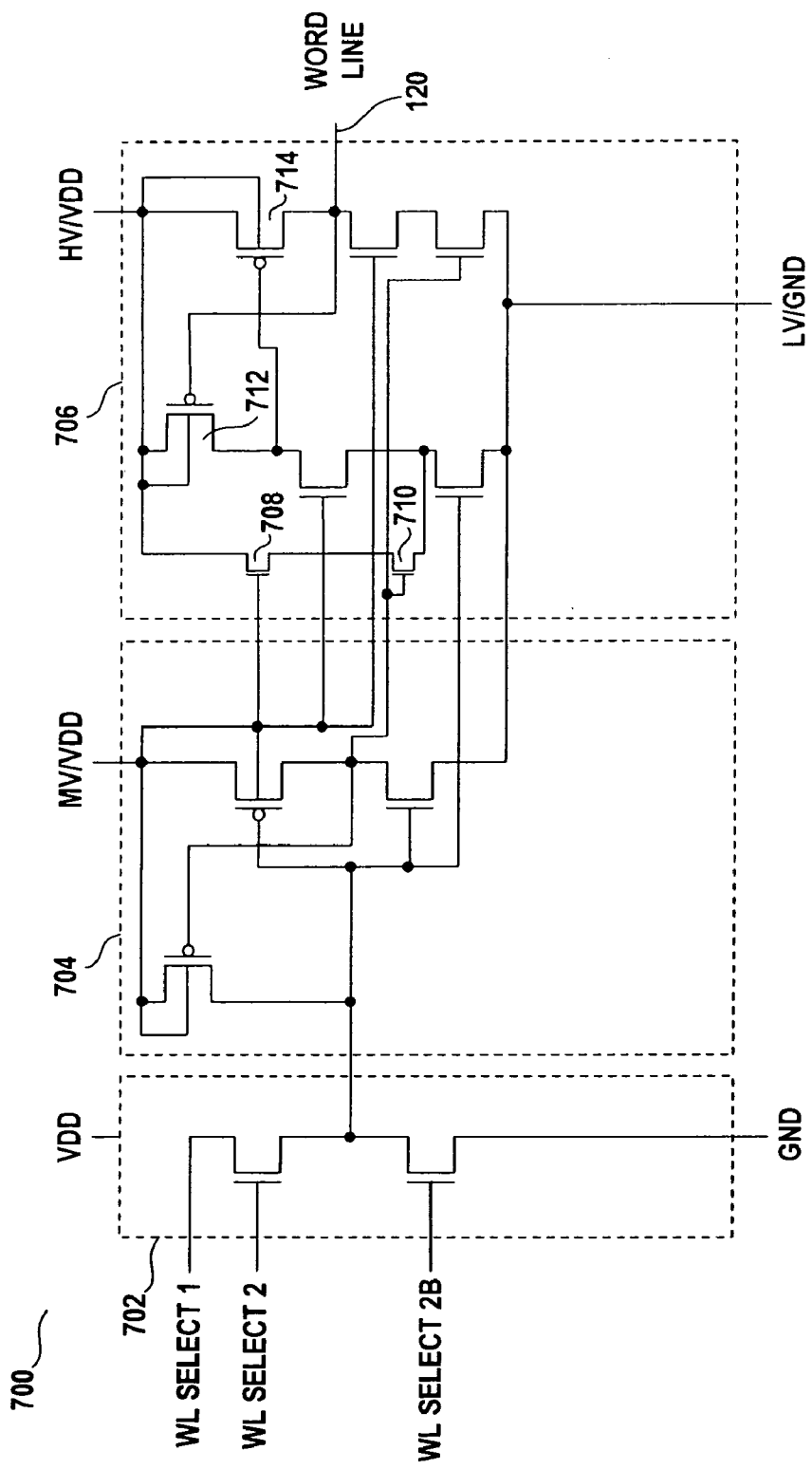
FIG. 7 presents a new modified three-stage wordline driver circuit in accordance with a fourth embodiment of the present invention.

FIG. 7 presents a new three-stage HV wordline driver circuit 700 in accordance with a fourth embodiment of the present invention. In this embodiment, multiple wordlines are connected to the circuit 700 resulting in a heavy loading effect on the circuit output. Thus, additional pull up drive circuit capability is needed for the additional loading on the PMOS output transistors. This circuit 700 provides the additional drive capability while eliminating the high voltage gate oxide stress conditions present in conventional HV wordline driver circuits. The circuit 700 comprises a logic stage 702, a mid voltage stage 704, and a high voltage stage 706.

In this circuit, NMOS transistors 708 and 710 are added to the high voltage stage 706 to provide an increased current capability to a PMOS transistor 712 to pull up the gate voltage of a PMOS transistor 714 to HV/VDD for quickly turning off the transistor 712 due to the heavier wordline loading. When the wordline output 120 is expected to be at LV, the cascoded NMOS transistors 708 and 710 help to pull the drain ends of the two NMOS transistors that are in series with the PMOS transistor 712 to HV so that the PMOS pull-up transistor 714 can be shut off immediately. Thus the slew rate of the circuit 700 remains unaffected even with the heavier wordline loading on the wordline 120.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A wordline driver circuit for a memory device, the circuit comprising:
   a logic stage operating between a ground voltage and a first supply voltage during a programming process for receiving one or more input signals from a decoder of the memory device and generating a logic stage output signal swinging between the ground voltage and the first supply voltage;
   a mid voltage stage, operating between a raised ground voltage and a second supply voltage during the programming process, having a pull-down transistor serially coupled to a pull-up transistor whose gate and drain are cross-connected to those of a feedback gate control transistor, and having the gates of the pull-down and pull-up transistors receiving the logic stage output signal,
   a high voltage stage, operating between the raised ground voltage and a third supply voltage during the programming process, and having a pull-down transistor serially coupled to a pull-up transistor whose gate and drain are cross-connected to those of a feedback gate control transistor;
   wherein the second supply voltage is between the third supply voltage and the raised ground voltage,
   wherein the pull-down and pull-up transistors in the mid and high voltage stages are coupled between the raised ground voltage and the second and third supply voltages respectively, and
   wherein the gate of the pull-down transistor in the high voltage stage is controlled by the drain of the pull-up transistor in the mid voltage stage.

2. The circuit of claim 1, wherein the mid voltage stage further comprises at least one switch for selectively passing a signal on the drain of the pull-up transistor to the gate of the pull-up transistor of the high voltage stage.

3. The circuit of claim 2, wherein the switch is an NMOS transistor whose gate is coupled to the second supply voltage and whose source is coupled to the drain of the pull-up transistor of the mid voltage stage, and the drain is coupled to the gate of the pull-up transistor of the high voltage stage.

4. The circuit of claim 1, wherein a difference between the third supply voltage and the raised ground voltage is no more than a breakdown voltage of the pull-down transistor in the high voltage stage.

5. The circuit of claim 1, wherein a difference between the second supply voltage and the raised ground voltage is no smaller than a threshold voltage of the pull-down transistor in the high voltage stage.

6. The circuit of claim 1, further comprising at least one additional pull-down transistor coupled in series with and between the feedback gate control transistor and the raised ground voltage in the high voltage stage, wherein the gate of the additional pull-down transistor is coupled to the gates of the pull-up and pull-down transistors of the mid voltage stage, thereby isolating the pull-up and pull-down transistors of the high voltage stage from signals from the mid voltage stage.

7. The circuit of claim 6, wherein the third supply voltage is greater than the first supply voltage.

8. The circuit of claim 6, further comprising at least one cascoded transistor between the pull-up transistor and the pull-down transistor in the high voltage stage with its gate controlled by the second supply voltage for reducing stress on the pull-down transistor.

9. The circuit of claim 8, further comprising at least one cascoded transistor between the feedback gate control transistor and the additional pull-down transistor.

10. The circuit of claim 6, further comprising a pair of serially coupled NMOS transistors between the third supply voltage and a drain of the additional pull-down transistor in the high voltage stage, wherein one of the NMOS transistors has a gate coupled to the second supply voltage directly, and another has a gate coupled to the second supply voltage indirectly.

11. The circuit of claim 1, wherein the raised ground voltage is a predetermined voltage, thereby reducing stress on the pull-down transistor in the high voltage stage during the programming process.

12. A wordline driver circuit for a memory device, the circuit comprising:
- a logic stage operating between a ground voltage and a first supply voltage during a programming process for receiving one or more input signals from a decoder of the memory device and generating a logic stage output signal swinging between the ground voltage and the first supply voltage;
- a mid voltage stage, operating between a raised ground voltage and a second supply voltage during the programming process, for receiving the logic stage output and generating a mid voltage stage output that swings between the second supply voltage and the raised ground voltage,
- a high voltage stage, operating between the raised ground voltage and a third supply voltage during the programming process, for generating a wordline driver output swinging between the third supply voltage and the raised ground voltage based on the received mid voltage stage output,
- wherein the second supply voltage is between the third supply voltage and the raised ground voltage,
- wherein a voltage difference between a gate of a pull-down transistor in the high voltage stage, whose drain provides the wordline driver output, and its source is no more than a difference between the second supply voltage and the raised ground voltage, and
- wherein a difference between the second supply voltage and the raised ground voltage is no smaller than a threshold voltage of the pull-down transistor.

13. The circuit of claim 12 wherein the mid voltage stage further includes a pull-down transistor serially coupled to a pull-up transistor whose gate and drain are cross-connected to those of a feedback gate control transistor, wherein the logic stage output is coupled to the gates of the pull-up and pull-down transistors.

14. The circuit of claim 13, wherein the mid voltage stage further comprises at least one switch for selectively passing the mid voltage stage output to control one or more transistors in the high voltage stage.

15. The system of claim 14, wherein the switch is an NMOS transistor whose gate is coupled to the second supply voltage and whose source is coupled to the mid voltage stage output, and whose drain is coupled to one or more transistors of the high voltage stage.

16. The system of claim 12, wherein a difference between the third supply voltage and the raised ground voltage is no more than a breakdown voltage of the pull-down transistor in the high voltage stage.

17. A wordline driver circuit for a memory device comprising:
- a logic stage operating between a ground voltage and a first supply voltage during a programming process for receiving one or more input signals from a decoder of the memory device and generating a logic stage output signal swinging between the ground voltage and the first supply voltage;
- a mid voltage stage, operating between a raised ground voltage and a second supply voltage during the programming process, having a pull-down transistor serially coupled to a pull-up transistor whose gate and drain are cross-connected to those of a feedback gate control transistor, and having the gates of the pull-down and pull-up transistors receiving the logic stage output signal,
- a high voltage stage, operating between the raised ground voltage and a third supply voltage during the programming process, and having a pull-down transistor serially coupled to a pull-up transistor whose gate and drain are cross-connected to those of a feedback gate control transistor,
- wherein the gate of the pull-down transistor in the high voltage stage is controlled by the drain of the pull-up transistor in the mid voltage stage,
- wherein a difference between the third supply voltage and the raised ground voltage is no more than a breakdown voltage of the pull-down transistor in the high voltage stage, and
- wherein a difference between the second supply voltage and the raised ground voltage is no smaller than a threshold voltage of the pull-down transistor in the high voltage stage.

18. The system of claim 17, further comprising at least one additional pull-down transistor coupled in series with and between the feedback gate control transistor and the raised ground voltage in the high voltage stage, wherein the gate of the additional pull-down transistor is coupled to the gates of the pull-up and pull-down transistors of the mid voltage stage, thereby isolating the pull-up and pull-down transistors of the high voltage stage from signals from the mid voltage stage, wherein an operation of the memory device requires the third supply voltage to be lower than the first supply voltage.

19. The system of claim 18, further comprising:
- at least one cascoded transistor between the pull-up transistor and the pull-down transistor in the high voltage stage with its gate controlled by the second supply voltage for reducing stress on the pull-down transistor; and
- at least one cascoded transistor between the feedback gate control transistor and the additional pull-down transistor in the high voltage stage.

20. The system of claim 18, further comprising a pair of serially coupled NMOS transistors between the third supply voltage and a drain of the additional pull-down transistor in the high voltage stage, wherein one of the NMOS transistors has a gate coupled to the second supply voltage directly, and another has a gate coupled to the second supply voltage indirectly.

21. The system of claim 17, wherein the raised ground voltage is a predetermined voltage, thereby reducing stress on the pull-down transistor in the high voltage stage during the programming process.

* * * * *